(12) United States Patent
Chen et al.

(10) Patent No.: US 7,701,549 B2
(45) Date of Patent: Apr. 20, 2010

(54) METHOD AND APPARATUS TO PREVENT CONTAMINATION OF OPTICAL ELEMENT BY RESIST PROCESSING

(75) Inventors: Chin Yu Chen, Shanghai (CN); Hsu Sheng Chang, Shanghai (CN); Sai Hung Lam, Shanghai (CN); Zheng Long Tang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 810 days.

(21) Appl. No.: 11/512,662

(22) Filed: Aug. 29, 2006
(Under 37 CFR 1.47)

(65) Prior Publication Data

US 2008/0106708 A1 May 8, 2008

(30) Foreign Application Priority Data

Mar. 9, 2006 (CN) .................. 2006 1 0024531

(51) Int. Cl.
*G03B 27/52* (2006.01)
(52) U.S. Cl. .................. 355/30; 355/53; 396/184
(58) Field of Classification Search .......... 355/30, 355/53; 396/183, 184
See application file for complete search history.

(56) References Cited

U.S. PATENT DOCUMENTS

| | | | | |
|---|---|---|---|---|
| 4,583,840 A | * | 4/1986 | Yabu et al. | 355/30 |
| 5,097,136 A | * | 3/1992 | Meyer et al. | 250/492.1 |
| 6,542,220 B1 | * | 4/2003 | Schrijver et al. | 355/53 |
| 6,721,031 B2 | * | 4/2004 | Hasegawa et al. | 355/30 |
| 2002/0000519 A1 | * | 1/2002 | Tsukamoto | 250/492.1 |
| 2004/0233401 A1 | * | 11/2004 | Irie | 355/30 |
| 2005/0036121 A1 | * | 2/2005 | Hoogendam et al. | 355/30 |
| 2005/0122493 A1 | * | 6/2005 | Tominaga | 355/30 |

FOREIGN PATENT DOCUMENTS

JP 11111587 A * 4/1999

OTHER PUBLICATIONS

Machine translation of JP H11-111587.*

* cited by examiner

*Primary Examiner*—Hung Henry Nguyen
*Assistant Examiner*—Steven H Whitesell-Gordon
(74) *Attorney, Agent, or Firm*—Townsend and Townsend and Crew LLP

(57) ABSTRACT

A method and apparatus to eliminate contaminants in a lithography process for fabrication of integrated circuit devices. The method includes depositing a photoresist material on surface of a semiconductor substrate. A purge gas flow is provided proximate to an optical element to prevent a vapor from the exposed photoresist material from coming into contact with the optical element. In one embodiment, the purge gas flows into a perforated and open ended enclosure in which the optical element is provided in the form of a lens. One open end of the enclosure is coupled to the lens and the other open end is positioned above the surface of the semiconductor substrate. Perforation of the enclosure facilitates movement of purge gas thereto, eliminating contact with the vapor from the developed resist and unwanted deposition of a solid contamination on the lens.

10 Claims, 7 Drawing Sheets

METHOD AND APPARATUS TO PREVENT CONTAMINATION OF OPTICAL ELEMENT BY RESIST PROCESSING

CROSS-REFERENCES TO RELATED APPLICATIONS

This application claims priority to Application No. 200610024531.X, filed with the Patent Office of the People's Republic of China on Mar. 9, 2006, commonly assigned herewith and incorporated by reference herein for all purposes.

BACKGROUND OF THE INVENTION

The present invention is directed to integrated circuits and their processing for the manufacture of semiconductor devices. More particularly, the invention provides a method and an apparatus for lithography process for the manufacture of integrated circuits. But it would be recognized that the invention has a much broader range of applicability. For example, the invention can be applied to a variety of devices such as dynamic random access memory devices, static random access memory devices (SRAM), application specific integrated circuit devices (ASIC), microprocessors and microcontrollers, Flash memory devices, and others.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed.

An example of a semiconductor process that is important to make smaller and smaller devices is lithography process for the manufacture of integrated circuits. Lithography process includes steps of depositing a photoresist material, patterning and developing the photoresist material.

Certain conventional ways in lithography process have become difficult to perform in an efficient and accurate manner. For example, critical optical components or parts may become contaminated during development steps, incurring error and inconsistency.

From the above, it is seen that an improved technique for processing semiconductor devices is desired.

BRIEF SUMMARY OF THE INVENTION

According to present invention, techniques for processing semiconductor integrated circuits are provided. More particularly, the invention provides a method and an apparatus for a lithography process for manufacture of integrated circuits. Merely by way of example, the invention has been applied to a wafer edge expose process step in the lithography process.

An embodiment of an apparatus in accordance with the present invention for processing a substrate, comprises, a process chamber configured to support a substrate therein, a light source, and an optical element in optical communication with the light source and configured to expose selected regions of a substrate to radiation from the light source. A gas delivery system is configured to flow a gas proximate to the optical element in order to isolate the optical element from a vapor present during a processing step.

An embodiment of a method in accordance with the present invention for processing a substrate, comprises, forming a resist material on a surface of a substrate, exposing a region of the substrate to radiation through an optical element, and providing a purge gas flow proximate to the optical element, the purge gas flow preventing a vapor from the exposed substrate from depositing solid material on the optical element.

An embodiment of a method in accordance with the present invention for reducing contamination in a semiconductor fabrication tool, comprises, exposing a resist material on a substrate to radiation, and providing a purge gas flow to an optical element disposed proximate to the exposed resist material, such that the purge gas flow prevents a vapor from the exposed resist material from depositing solid material on the optical element.

Various additional objects, features, and advantages of the present invention can be fully appreciated with reference to the detailed description and accompanying drawings that follow.

DETAILED DESCRIPTION OF THE INVENTION

Figure 1A:
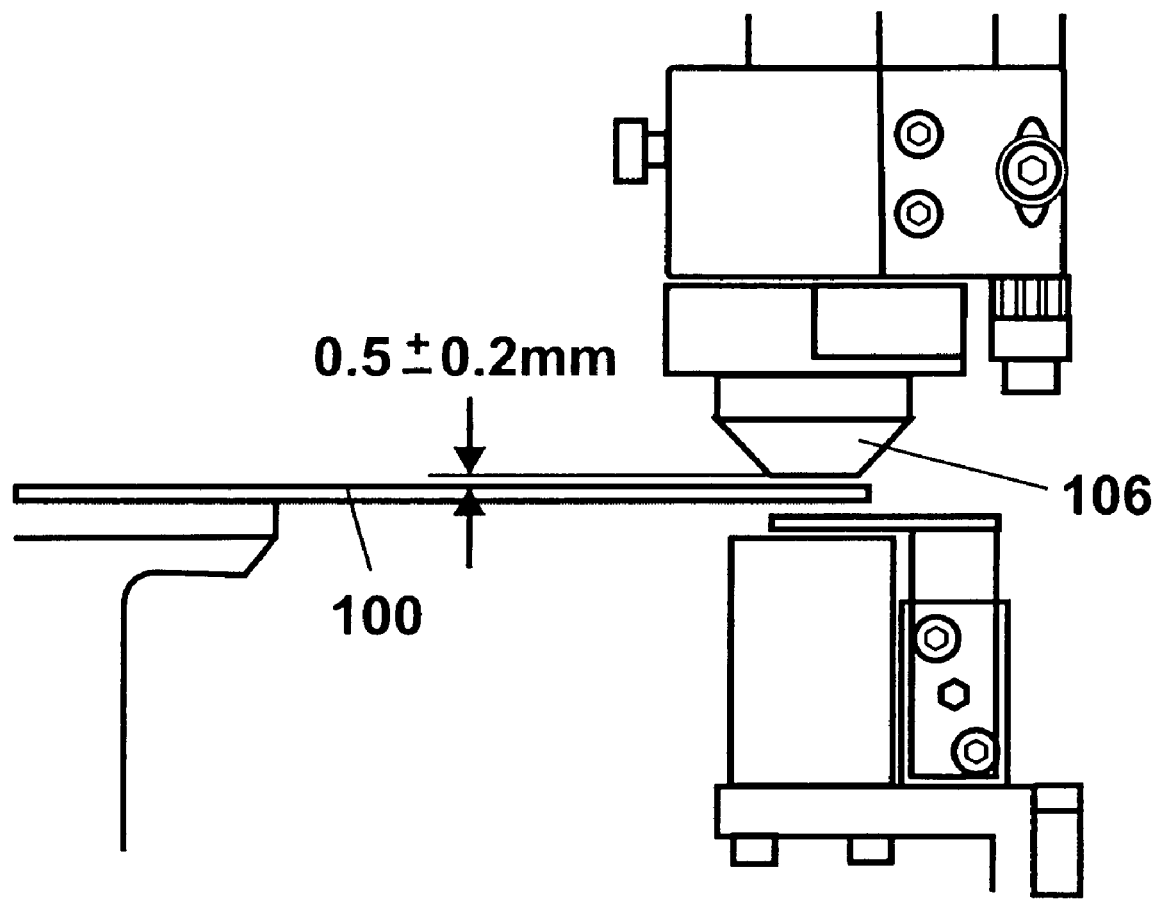
FIG. 1(a) is a simplified cross-sectional view illustrating a conventional apparatus for processing a semiconductor integrated circuit device.

According to present invention, techniques for processing semiconductor integrated circuit devices are provided. More particularly, the present invention provides a method and an apparatus for a lithography process for manufacture of integrated circuits. Merely by way of example, the invention has been applied to a wafer edge expose step in a lithography process.

In a specific embodiment, an apparatus for a lithography process for fabricating semiconductor integrated devices is provided. The apparatus includes providing a process chamber. The process chamber may be configured for a track tool for lithography process. The apparatus includes an illumination system, the illumination system provides a light source to expose photoresist material on selected regions on a semiconductor substrate. As an example, the light source can be a ArF laser emitting a ultraviolet light at a wavelength of 193 nm. The apparatus includes a fiber optic to direct light from the light source to the semiconductor substrate. The apparatus may also include a shutter to control exposure of the photoresist material on selected regions on the semiconductor substrate. The apparatus includes an optical element. For example, the optical element can be a lens to expose portions of the semiconductor substrate and may comprise material such as calcium fluoride in a specific embodiment. The optical element is positioned at an end of the fiber optics and at a distance from the semiconductor substrate. This distance may range from about 0.3-0.5 mm in accordance with certain embodiments. The apparatus also includes an enclosure having a first opened ending and a second opened ending. The first opened ending is coupled to the optical element and the second opened ending is positioned above the semiconductor substrate. The enclosure is perforated and may be substantially cylindrical. The apparatus includes a gas delivery system to provide a gas to flow through the enclosure. The gas is provided to isolate the optical element from a vapor component of the photoresist material during exposure in the lithography process and eliminates a solid material from depositing on the optical element, thereby maintaining the intensity of light transmitted through the optical element at a desired level. The apparatus may also include a gas control system. The gas control system includes a solenoid valve to provide opening/shutting of the shutter, a air-spring valve to control the gas flows through the enclosure, and a three way valve. The three way valve is coupled in common to the solenoid valve and the air-spring valve and provides a mean to simultaneously flow the gas through the enclosure and to open the shutter for exposure of the photoresist material.

In a specific embodiment, a method for fabricating semiconductor integrated circuits is provided. The method includes providing a semiconductor substrate. The semiconductor substrate has a surface and may have devices partially fabricated on it. A photoresist material is deposited overlying the surface of the semiconductor substrate. The method includes disposing the semiconductor substrate on a pedestal of a track tool. The method includes directing a ultraviolet light onto the surface of the semiconductor substrate to expose the photoresist material in a pre-select region of the semiconductor substrate. Other region of the semiconductor substrate is masked. In a specific embodiment, the pre-select region of the semiconductor substrate includes a peripheral region. The peripheral region ranges from 3 to 5 mm from wafer edge in certain embodiments.

The ultraviolet light may be transmitted from a source using a fiber optic. A lens is coupled to an end of the fiber optic to expose the wafer. The lens comprises calcium fluoride in certain embodiment. The ultraviolet light may be provided using an ArF laser at a wavelength of 193 nm in certain embodiments. The ultraviolet light interacts with the exposed photoresist material in the peripheral region of the semiconductor substrate and thereby causes a vapor to form. Due to the vicinity of the lens to the wafer, the vapor cannot be removed effectively by exhaust, and may condense on the lens as a salt to form a crystalline material. The crystalline material reduces intensity of the light transmitted through the lens. The method includes providing a gas flowing through an enclosure coupled to the lens simultaneously with the exposing step. The enclosure is perforated and substantially cylindrical. The gas removes the vapor from the photoresist material during exposure and prevents the crystal material to form on the lens. The intensity of the ultraviolet light transmitted through the lens can be maintained at a desired level.

Many benefits are achieved by ways of the present invention. For example, the present invention provides a method and an apparatus to prevent contamination of optical components used in lithography process. Additionally, the method and apparatus are compatible to conventional process technology without substantial modification to conventional processes. Depending on the embodiment, one or more of the benefits may be achieved. These and other benefits will be described in more detail throughout the specification and more particularly below.

Figure 1B:
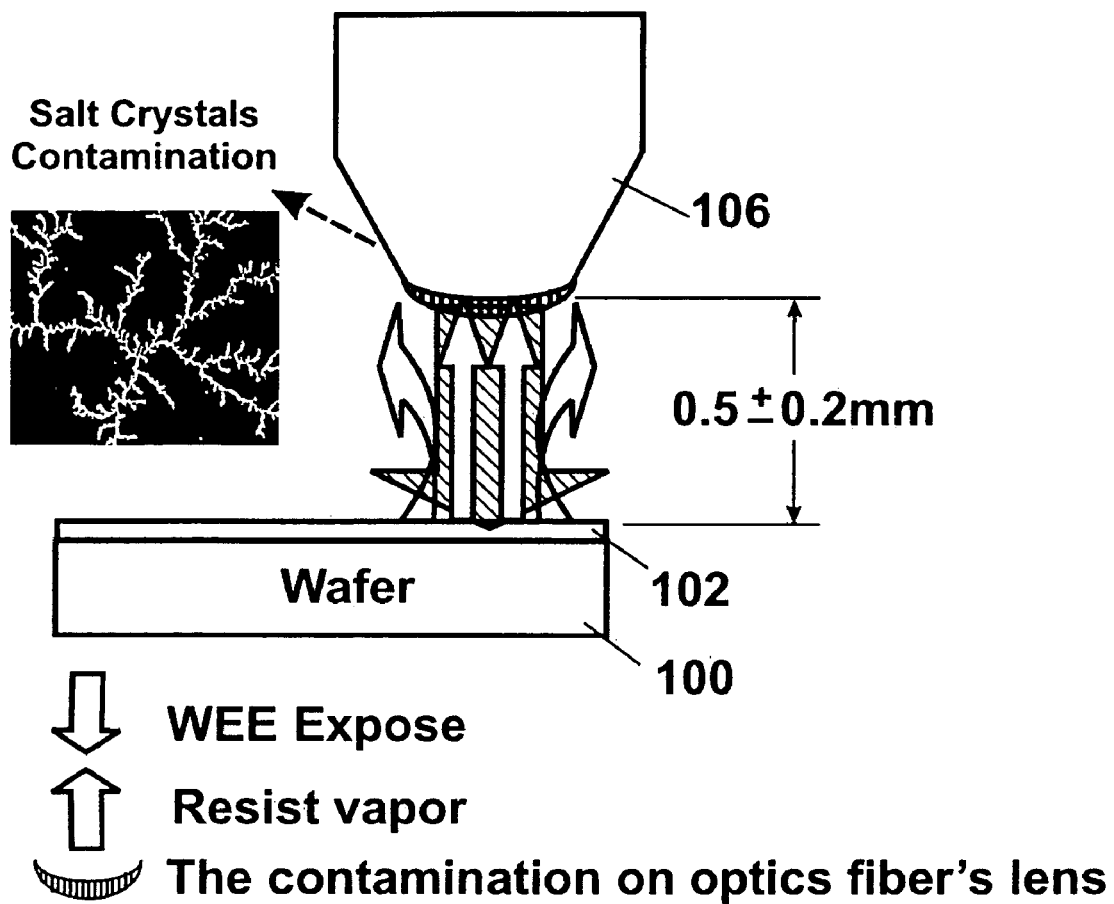
FIG. 1(b) is a simplified schematic diagram illustrating use of the conventional apparatus shown in FIG. 1(a).
Figure 1C:
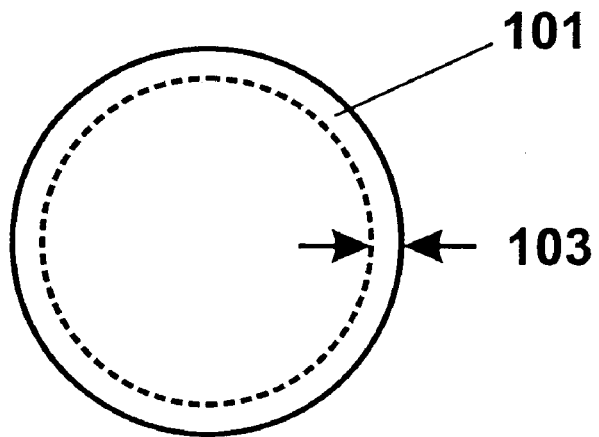
FIG. 1(c) is a simplified plan view of a wafer undergoing development steps to create a wafer edge expose region.

FIGS. 1(a)-(c) illustrate a wafer edge expose step in a lithography process. A semiconductor substrate 100 is provided. The semiconductor substrate may have devices partially fabricated thereon. A photoresist material 102 is deposited overlying the semiconductor substrate. As shown in FIG. 1(c), a wafer edge expose region 101 is defined in a peripheral region of the semiconductor substrate. The wafer edge expose region has a predetermined width from wafer edge. The predetermined width ranges from 3 mm to 5 mm in certain embodiment. The wafer edge expose region is exposed to an ultraviolet light while other region of the semiconductor substrate is masked using a photomask.

Illustrated in FIG. 1(a) is an apparatus according to a conventional method for a wafer edge expose step for a lithography process for manufacturing integrated circuits. As shown, an illumination system 10 for a wafer edge expose process is provided. The illumination system comprises of a ultraviolet light source (not shown). The ultraviolet light source may be a ArF laser emitting light at a wavelength of 193 nm. The ultraviolet light is transmitted using a fiber optic (not shown). Semiconductor wafer 100 including photoresist material 102 is disposed on a pedestal 104. A lens 106 coupled to an end of the fiber optic waveguide is positioned at a distance of about 0.5±0.2 mm from the wafer surface.

Illustrated in FIG. 1(b) is a schematic diagram showing use of the conventional apparatus of FIG. 1(a). When the photoresist material is exposed to the ultraviolet light in a wafer edge expose process, a vapor component of the photoresist is evaporated. Due to the proximity of the lens to the substrate, the vapor component cannot be removed effectively by exhaust system. The vapor component condenses as a solid crystal on the lens. The solid crystal reduces an intensity of light transmitted through the lens. The lens would need to be cleaned or even replaced if the deposit on the lens too severe. These and other limitations are described in more detailed throughout the specification.

Figure 2B:
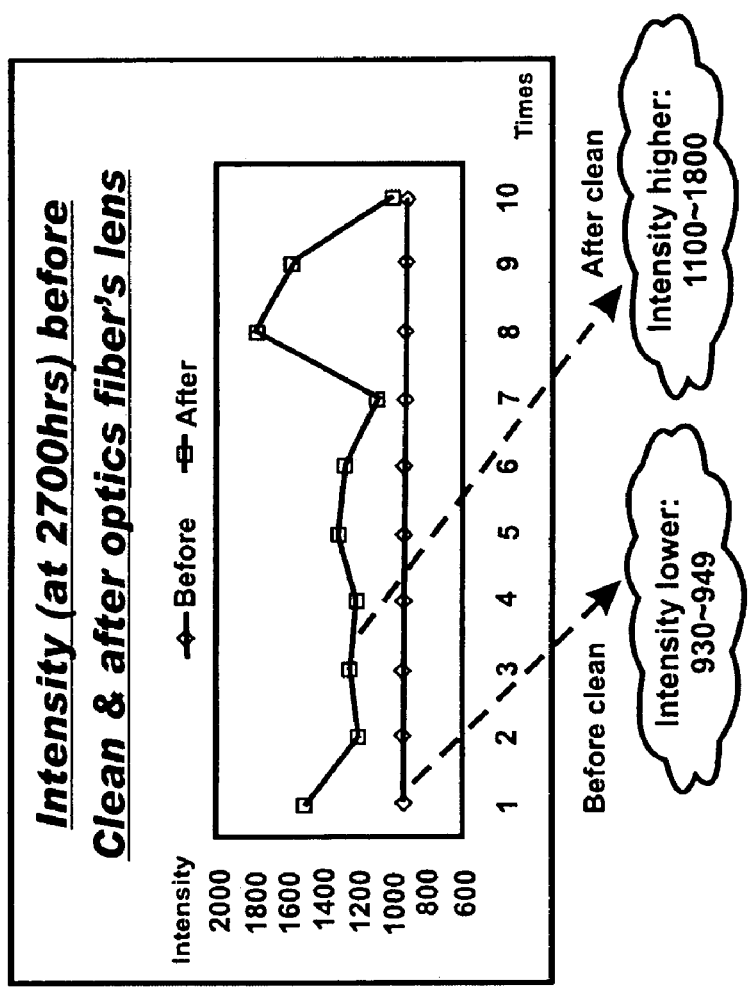
FIG. 2(b) is a simplified plot illustrating performance of a conventional apparatus for processing a semiconductor integrated circuit device.
Figure 2A:
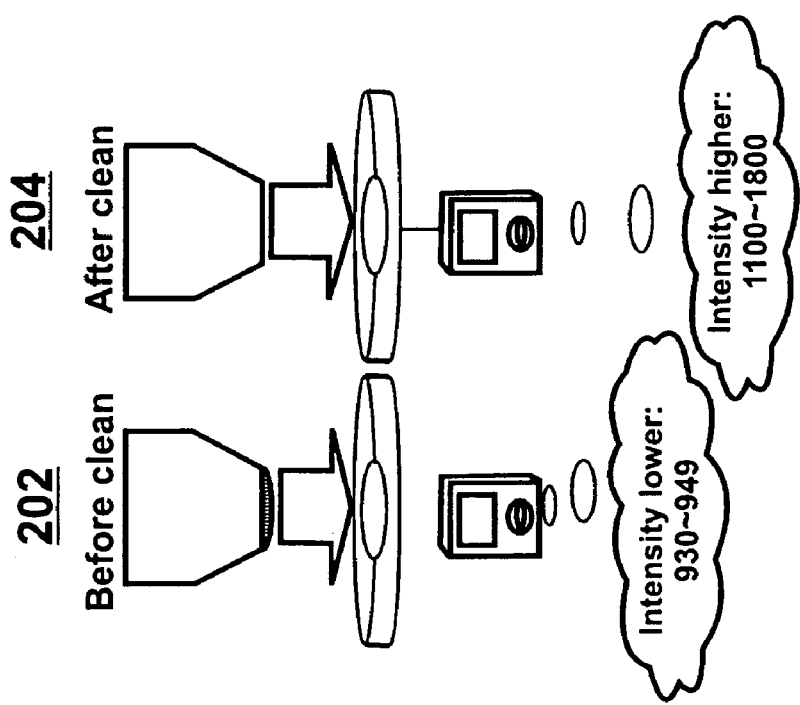
FIG. 2(a) is a simplified schematic diagram illustrating performance of a conventional apparatus for processing a semiconductor integrated circuit device.

Specifically, FIG. 2(a) is a simplified schematic diagram illustrating performance of a conventional apparatus for processing a semiconductor integrated circuit device. FIG. 2(b) is a simplified plot illustrating light intensity transmitted through lens 106 of the conventional apparatus after 2700 hours of use, for ten consecutive exposures performed prior to lens cleaning, and ten consecutive runs performed after lens cleaning. The vertical axis illustrates intensity of light passing through the optical element. As shown in plot 202, light intensity remains at a relatively low level (930-949 units) due to solid deposited on the lens. By contrast, as shown in plot 204, after cleaning the light intensity increases to 1100-1800 units. Such deposit on the lens and corresponding loss of intensity of transmitted light may eventually become severe enough to require replacement of the lens.

Figure 3A:
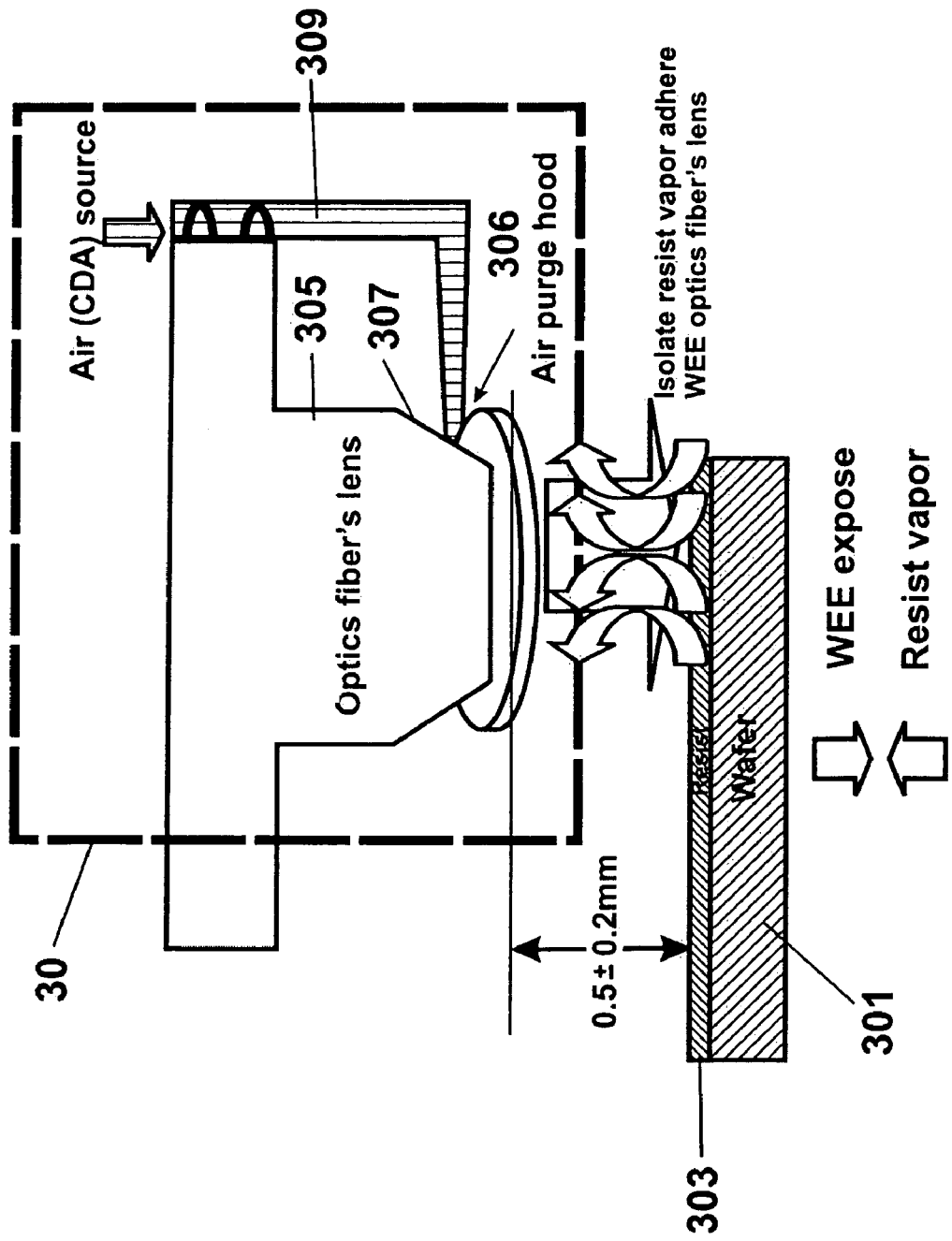
FIG. 3(a) is a simplified schematic diagram showing an apparatus for processing semiconductor integrated circuits according to an embodiment of the present invention.

FIG. 3(a) is a simplified schematic diagram showing an apparatus for processing semiconductor integrated circuits according to an embodiment of the present invention. This diagram is merely an example, which should not unduly limit the scope of the claims herein. One of ordinary skill in the art would recognize many variations, alternatives, and modifications.

Figure 3B:
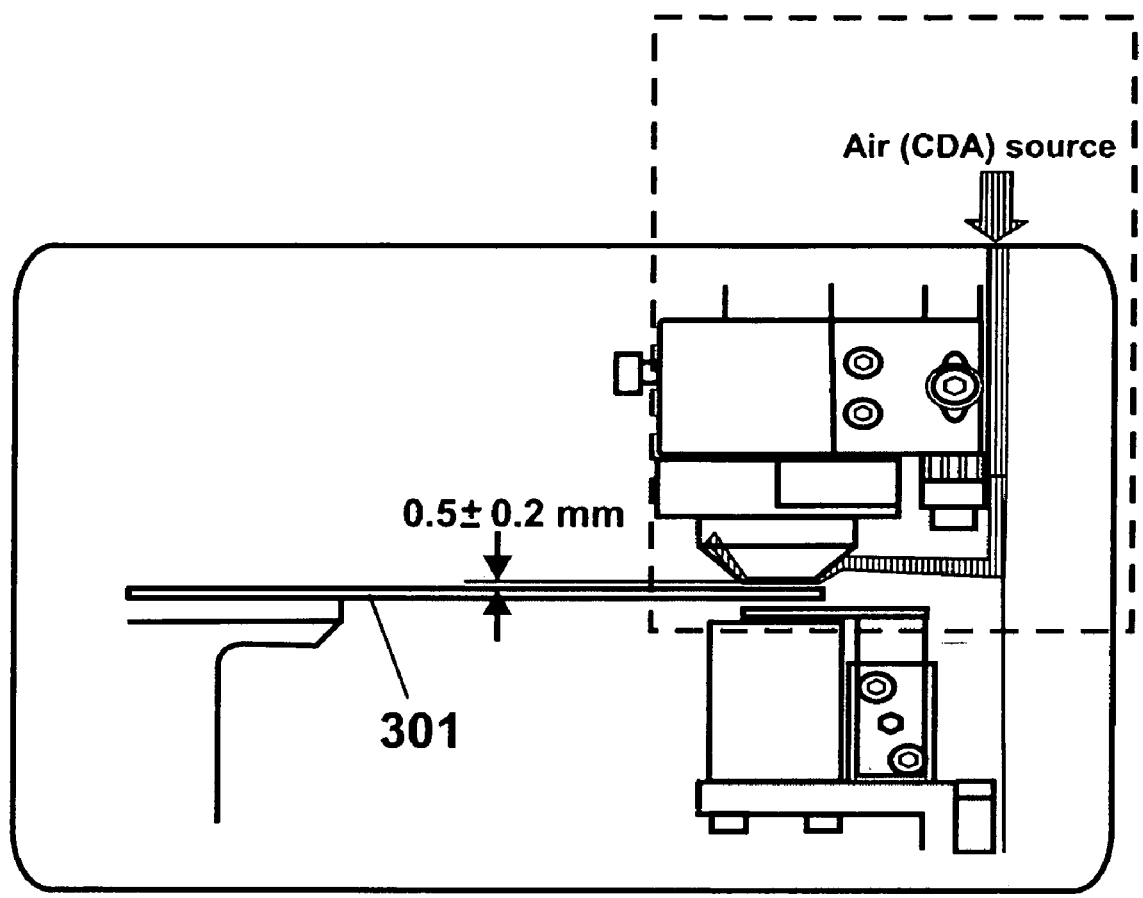
FIG. 3(b) is a simplified cross-sectional view of an illumination system for a lithography process.

As shown, a semiconductor substrate 301 is provided. The semiconductor substrate may have devices partially fabricated thereon. A photoresist material 303 is deposited on a surface of the semiconductor substrate. Shown in FIG. 3(b) is a simplified cross-sectional view of an illumination system 30 for lithography process. The illumination system is configured for wafer edge expose process in a specific embodiment. The wafer edge expose process exposes photoresist material in a peripheral region of the semiconductor substrate while other region is being masked. The peripheral region has a width of about 3-5 mm from the wafer edge in certain embodiments.

The illumination system includes a fiber optic waveguide to direct a light from a radiation source onto the semiconductor substrate. The light may be ultraviolet light having a wavelength of 193 nm or other wavelengths, as may be provided by an ArF laser in one specific embodiment. Other sources of radiation such as KrF laser or a mercury arc lamp may also be used. A lens 305 coupled to the fiber optic waveguide is used to expose desired regions of the semiconductor substrate, for example an edge exclusion region, to light. Lens 305 comprises calcium fluoride in certain embodiments. Other materials such as fused quartz may also be used depending on the application.

Figure 3C:
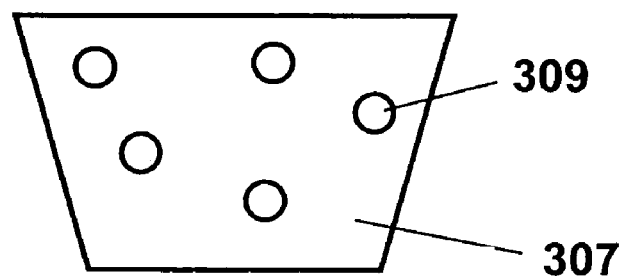
FIG. 3(c) is a simplified elevational view of one embodiment of an enclosure in accordance with the present invention.

As shown in FIGS. 3(a)-(b), a hood 306 is provided. The hood includes an enclosure 307 and a gas delivery line 309. FIG. 3(c) is a simplified elevational view of one embodiment of an enclosure in accordance with an embodiment of the present invention. The gas delivery line provides a purging gas to flow through the enclosure when the semiconductor substrate including a portion of the photoresist material is being exposed. The purging gas can be compressed air in a specific embodiment. Other examples of purging gas includes nitrogen or an inert gas mixture. The enclosure is substantially cylindrical and perforated. The perforations 309 facilitate movement of gas or vapor through the enclosure thereby preventing a vapor from the photoresist material to condense on the lens upon exposure to the ultraviolet light. In accordance with an embodiment of the present invention, the purge gas line in fluid communication with the optical element comprises a distinct system separate from the gas system utilized to purge process gases from the chamber. Further details of the gas delivery line and mechanism of operations are provided below.

Figure 4A:
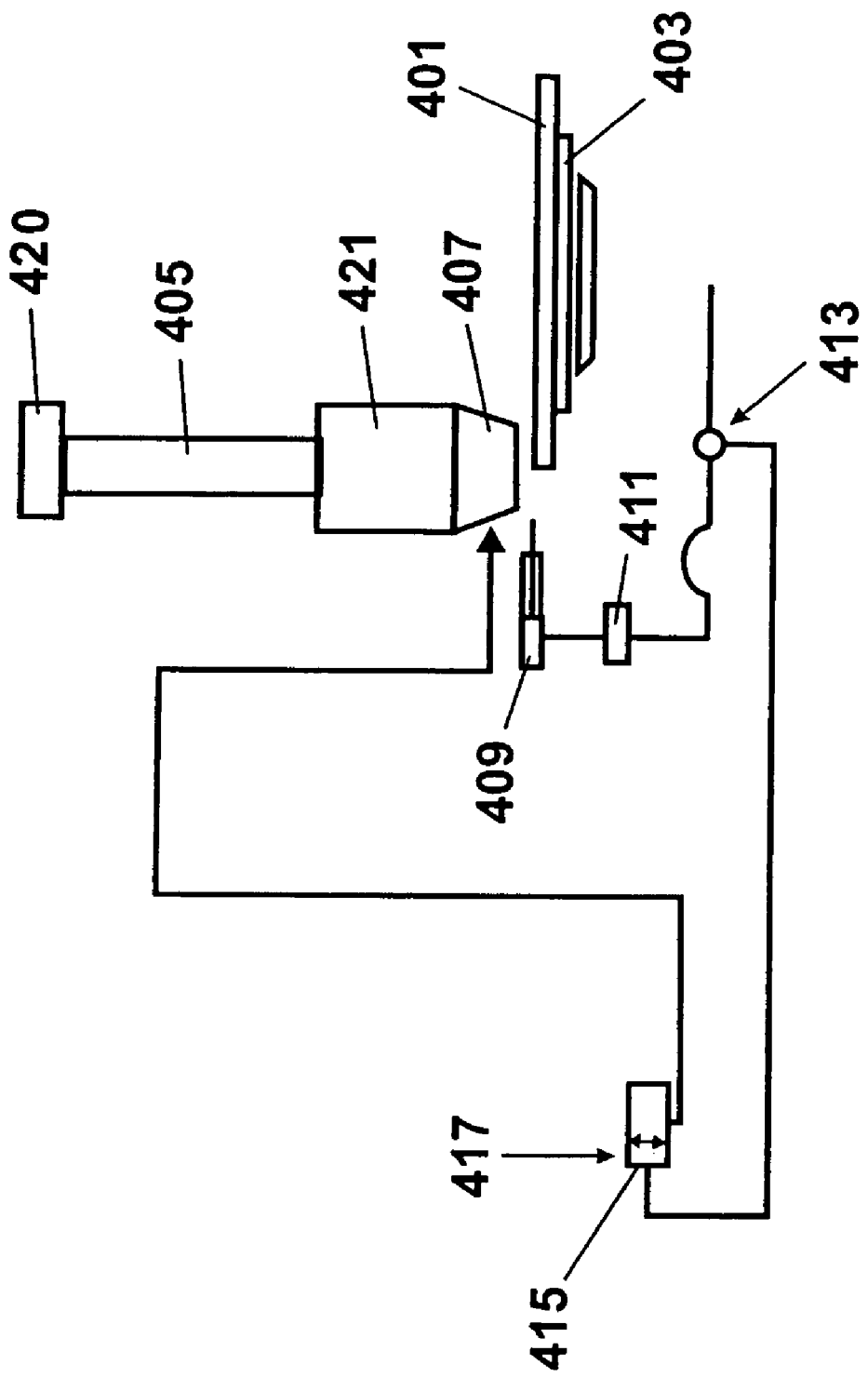
FIG. 4(a) is a simplified cross-sectional diagram illustrating an apparatus for processing semiconductor wafer according to an embodiment of the present invention.
Figure 4B:
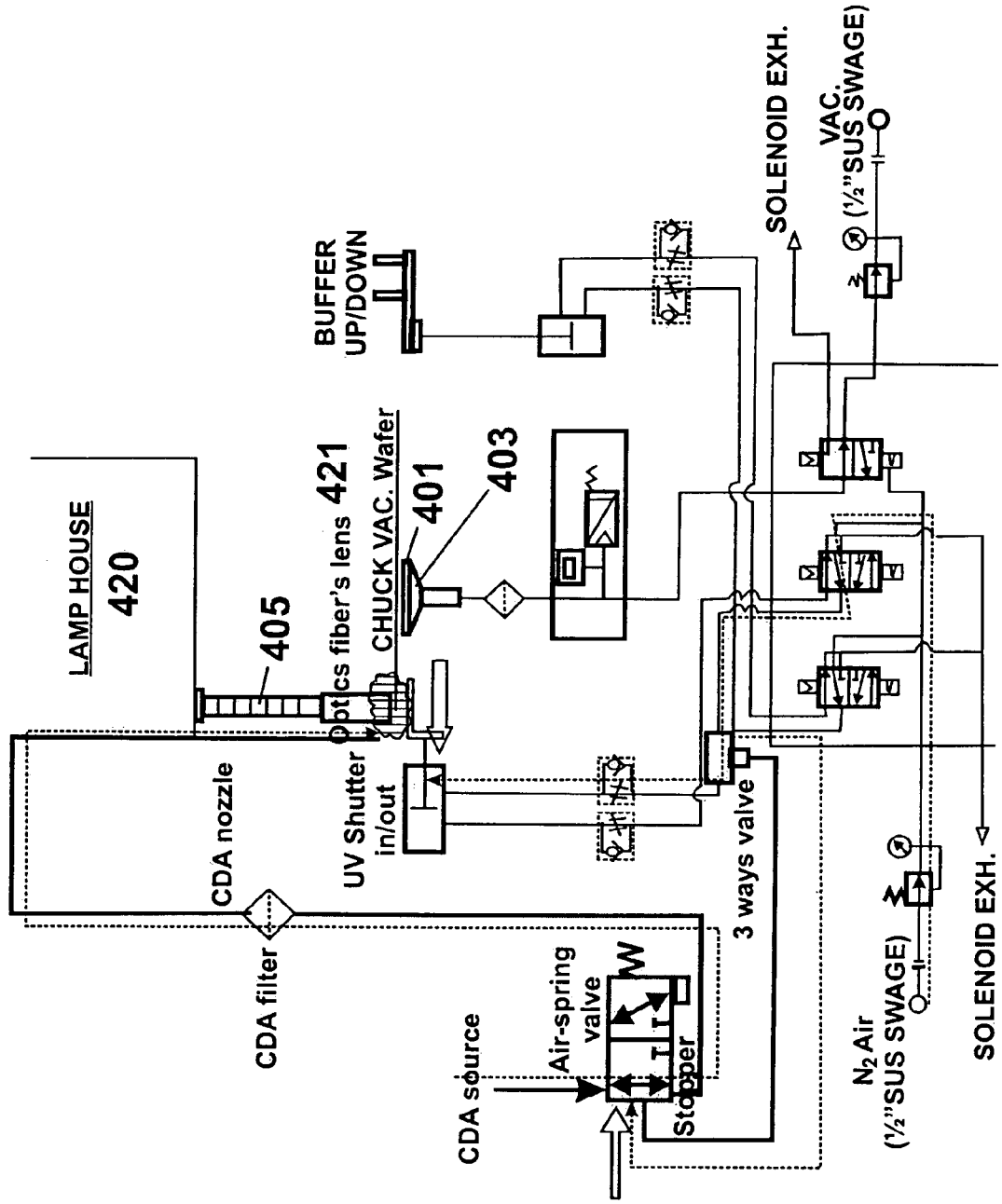
FIG. 4(b) is a simplified schematic diagram illustrating an apparatus for processing semiconductor wafer according to an embodiment of the present invention.

FIG. 4(a) is a simplified cross-sectional view of an apparatus for a lithography process for fabricating integrated circuits according an embodiment of the present invention. FIG. 4(b) is a simplified schematic view of the apparatus of FIG. 4(a). A semiconductor substrate is disposed on a chuck 403. A photoresist material is deposited on the surface of the semiconductor substrate. Also shown in FIGS. 4(a)-(b) is a fiber optic waveguide 405 to direct light from light source 420 for exposing the photoresist material in predetermined area on the semiconductor substrate. As merely an example, the predetermined area is a wafer edge expose area. A lens 421 to expose the wafer to light is provided at an end of the fiber optic. The lens is positioned at a predetermined distance from the semiconductor wafer. The distance measures 0.5±0.2 mm in a specific embodiment.

The apparatus includes a shutter 409 to allow exposure of the photoresist material. The shutter is controlled by a solenoid valve 411. The apparatus also includes an air-spring valve 415 coupled to a gas source 417. The air-spring valve controls a flow of the purging gas to flow through enclosure 407. The purging gas can be compressed air in a specific embodiment. Other examples of purging gas gases includes nitrogen or an inert gas.

The apparatus also includes a three way valve 413, coupled in common with air-spring valve 415 and solenoid valve 411. When a wafer is positioned for a wafer edge expose process, the three way valve opens and triggers solenoid valve 411 to open shutter 409 thereby exposing photoresist material on the semiconductor substrate. Simultaneously, the three way valve triggers air spring valve 415 to open, allowing the purging gas to flow. The purging gas together with a vapor from the photoresist material during wafer edge expose process is removed using existing exhaust system on the tool. This prevents a solid to crystallize on the lens and eliminate steps of cleaning the lens.

Although the above has been illustrated according to a specific embodiment, there can be other modifications, alternatives, and variations. For example, while the above embodiments has been described in connection with fabrication of devices on a semiconductor substrate, the present invention is not limited to this particular application. In accordance with alternative embodiments, the present invention could be employed in connection with the fabrication of other than semiconductor substrates, including but not limited to magnetic hard disk materials, optical hard disk materials such as are used for DVDs, CDs, and CD-ROMs, and flat panels comprising glass or other insulating materials.

Moreover, while the above embodiment has been described as preventing contamination during the development of photoresist, the present invention is not limited to this particular application. In accordance with alternative embodiments, contamination during other processes can be reduced or eliminated, for example during the development of electron beam resist materials.

And while the embodiments of the present invention illustrated above relate to prevention of contamination of an optical element in a photoresist developer tool, the present invention is not related to this particular embodiment. For example, vapor may continue to be produced by the resist material even after the exposure step. Accordingly, optical elements of other types of tools, including but not limited to the objective lenses of after develop inspection (ADI) tools or review optical microscope (OM) tools employed to inspect the exposed resist, may also be shielded from contamination by vapors utilizing alternative embodiments of the present invention.

It is also understood the embodiments and examples described herein are for illustrative purposes only and that various modifications or changes in light thereof will be suggested to person skilled in the art and are to be included with the spirit and purview of this application and scope of the appended claims.

What is claimed is:

1. An apparatus for processing a substrate, the apparatus comprising:
   a process chamber configured to support the substrate therein;
   a light source;

an optical element in optical communication with the light source and configured to expose selected regions of the substrate to radiation from the light source;

a gas delivery system configured to flow a gas proximate to the optical element in order to isolate the optical element from a vapor present during a processing step;

a moveable shutter configured to be interposed between the optical element and the substrate, wherein movement of the shutter between the optical element and the substrate is coincident with flow of the gas;

a first valve configured to control the shutter;

an second valve configured to control the gas flowing through an enclosure in which the optical element is positioned and in fluid communication with the gas delivery system; and a third valve coupled in common with the first valve and the second valve, wherein the first valve is a solenoid valve, the second valve is an air-spring valve, and the third valve is a three way valve, and wherein the gas flowing through the enclosure is provided simultaneously with opening of the shutter using the three way valve.

2. The apparatus of claim 1 wherein the gas comprises at least one of air, nitrogen, and an inert gas.

3. The apparatus of claim 1 wherein the optical element is positioned within an enclosure in fluid communication with the gas delivery system.

4. The apparatus of claim 3 wherein the enclosure is perforated to facilitate movement of gas or vapor through the enclosure.

5. The apparatus of claim 1 wherein the optical element is comprises a lens.

6. A method for processing a substrate, the method comprising:

depositing a resist material on a surface of a substrate;

exposing a region of the substrate to radiation through an optical element; and providing a purge gas flow proximate to the optical element, the purge gas flow preventing a vapor from the exposed substrate from depositing solid material on the optical element;

wherein the purge gas flow causes a shutter present between the optical device and the substrate to retract and allow the substrate to be exposed to the radiation.

7. The method of claim 6 wherein the optical element is provided within a perforated enclosure, and the purge gas flow is provided to the perforated enclosure to facilitate movement of the purge gas through the enclosure.

8. The method of claim 6 wherein the resist material comprises photoresist.

9. The method of claim 6 wherein the purge gas comprises at least one of air, nitrogen, and an inert gas.

10. The method of claim 6 wherein the purge gas is provided simultaneously with the exposing.

* * * * *